(12) United States Patent
Wilson

(10) Patent No.: US 7,907,020 B2
(45) Date of Patent: Mar. 15, 2011

(54) CONSTANT CALIBRATION

(75) Inventor: Thomas James Wilson, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 37 days.

(21) Appl. No.: 11/947,730

(22) Filed: Nov. 29, 2007

(65) Prior Publication Data

US 2009/0058535 A1 Mar. 5, 2009

Related U.S. Application Data

(60) Provisional application No. 60/967,233, filed on Aug. 31, 2007.

(51) Int. Cl.
*H03L 7/081* (2006.01)
(52) U.S. Cl. .............................. 331/44; 331/16; 331/17
(58) Field of Classification Search ............... 331/16, 331/17, 44
See application file for complete search history.

(56) References Cited

U.S. PATENT DOCUMENTS

| | | |
|---|---|---|
| 4,630,217 A | 12/1986 | Smith et al. |
| 5,483,201 A | 1/1996 | Bortolini |
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,854,450 A | 12/1998 | Kent |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 6,968,017 B2 | 11/2005 | Nielsen |
| 7,015,894 B2 | 3/2006 | Morohoshi et al. |
| 7,139,530 B2 | 11/2006 | Kusbel |
| 7,184,064 B2 | 2/2007 | Zimmerman et al. |
| 7,295,078 B2 * | 11/2007 | Coppola et al. .................. 331/44 |
| 7,432,749 B1 * | 10/2008 | Gehring et al. ............... 327/156 |
| 2003/0050029 A1 * | 3/2003 | Kaufmann et al. ........... 455/260 |
| 2003/0164820 A1 | 9/2003 | Kent |
| 2006/0026521 A1 | 2/2006 | Hotelling et al. |

(Continued)

FOREIGN PATENT DOCUMENTS

JP 2000-163031 A 6/2000

(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Robert Pascal
*Assistant Examiner* — James E Goodley
(74) *Attorney, Agent, or Firm* — Morrison & Foerster LLP

(57) ABSTRACT

An oscillating signal of relatively precise frequency can be generated by tuning an oscillator using an external stable oscillating source as a reference. Calibration logic can be included to compare a signal from the local oscillator to the reference signal and vary the local signal to a desired frequency. In one embodiment, the frequency of the local signal can be constantly or periodically compared with a threshold value and if the frequency exceeds the threshold value, the local oscillator can be modified to produce a signal having a frequency that is closer to a desired frequency.

29 Claims, 10 Drawing Sheets

U.S. PATENT DOCUMENTS

2006/0097991 A1 5/2006 Hotelling et al.
2006/0197753 A1 9/2006 Hotelling
2006/0214921 A1* 9/2006 Takahashi et al. ............ 345/173

FOREIGN PATENT DOCUMENTS

JP 2002-342033 A 11/2002

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

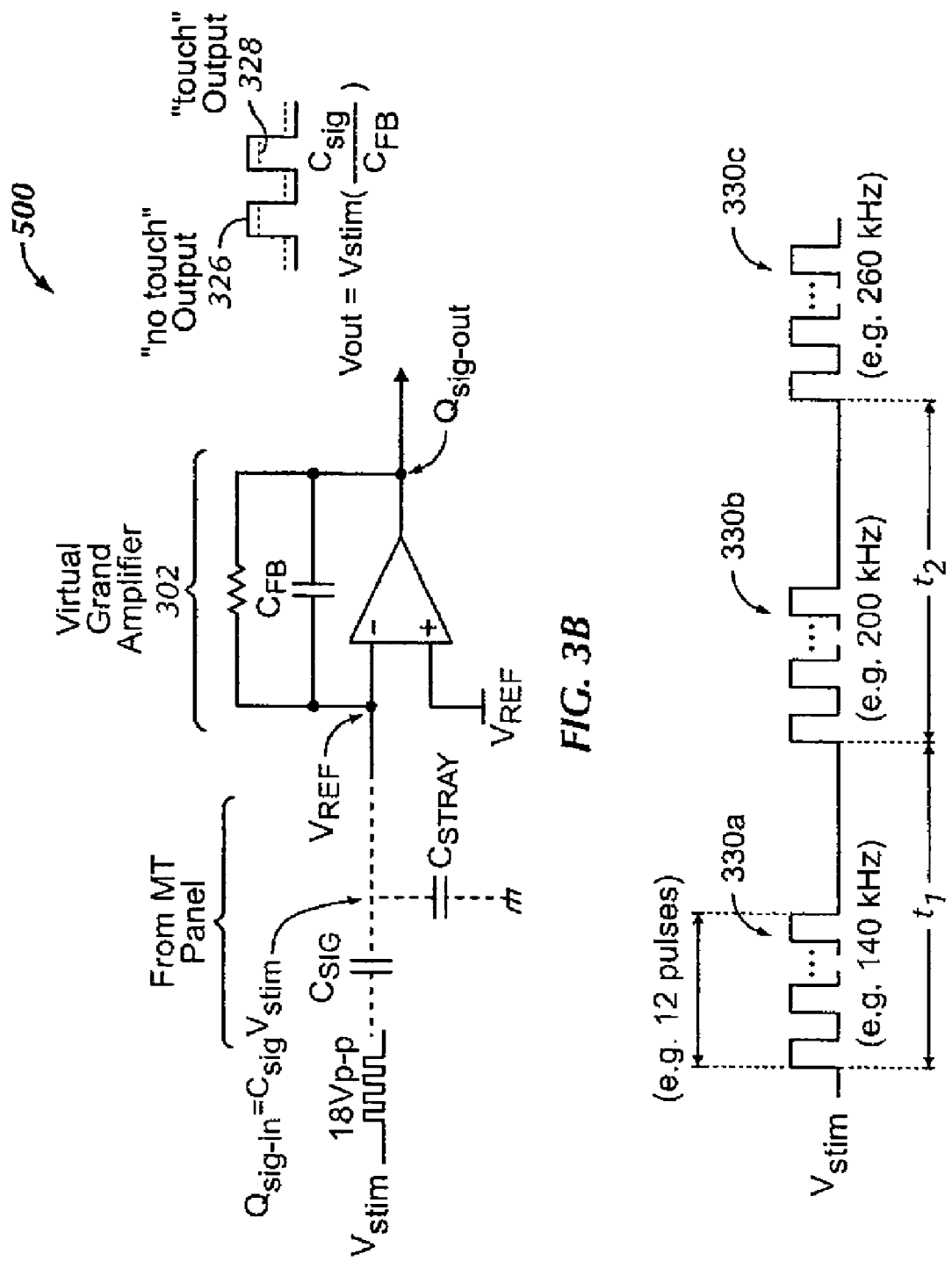

US 7,907,020 B2

CONSTANT CALIBRATION

RELATED APPLICATIONS

The present application claims priority from provisional application Ser. No. 60/967,233 filed on Aug. 31, 2007 and entitled "CONSTANT CALIBRATION". The above referenced provisional application is also incorporated herein by reference.

FIELD OF THE INVENTION

The present invention relates to tuned oscillation circuits for electronic devices, and more particularly to tuning a variable oscillator to produce a precise oscillating signal.

BACKGROUND OF THE INVENTION

Many types of input devices are presently available for performing operations in a computing system, such as buttons or keys, mice, trackballs, touch panels, joysticks, touch screens and the like. Touch screens, in particular, are becoming increasingly popular because of their ease and versatility of operation as well as their declining price. Touch screens may include a touch panel, which may be a clear panel with a touch-sensitive surface. The touch panel may be positioned in front of a display screen so that the touch-sensitive surface covers the viewable area of the display screen. Touch screens may allow a user to make selections and move a cursor by simply touching the display screen via a finger or stylus. In general, the touch screen may recognize the touch and position of the touch on the display screen, and the computing system may interpret the touch and thereafter perform an action based on the touch event.

One limitation of many conventional touch panel technologies is that they are only capable of reporting a single point or touch event, even when multiple objects come into contact with the sensing surface. That is, they lack the ability to track multiple points of contact at the same time. Thus, even when two points are touched, these conventional devices only identify a single location, which is typically the average between the two contacts (e.g., a conventional touchpad on a notebook computer provides such functionality). This single-point identification is a function of the way these devices provide a value representative of the touch point, which is generally by providing an average resistance or capacitance value.

Moreover, many touch-panel devices use oscillating signals to power and clock electronic elements. Examples of their use include providing clock signals, or providing carrier signals which can later be modified to include information. For example, an oscillating signal can be used to drive a row in a capacitive touch sensor panel. Changes to the sensed signal indicate a touch event at the panel.

There are various known ways to create an oscillating signal. For example, persons of skill in the art would recognize that a simple circuit including an inductor and a capacitor would create such a signal. However, most circuit based oscillators suffer from the fact that they do not provide a signal with a precise and predictable frequency.

SUMMARY OF THE INVENTION

An oscillating signal of relatively precise frequency can be generated by tuning a local oscillator using an external stable oscillating source as a reference. Calibration logic can be included to compare a signal from the local oscillator to the reference signal and vary the local signal to a desired frequency. In one embodiment, a binary search algorithm can be used to tune the local oscillator. The local oscillating signal can be sent to one or more circuits including at least one frequency sensitive element.

An oscillator circuit can include a voltage or current controlled oscillator. The circuit can include an input which receives a control signal having a particular voltage or current. The oscillator circuit can be configured to output an oscillating signal having a frequency defined by the inputted voltage or current. The oscillating signal can be sent to one or more circuits including at least one frequency sensitive element.

The calibration logic block can modify the frequency of the local oscillating signal by outputting control signals of varying magnitude. The calibration logic block can find a desired frequency in which the frequency sensitive element operates as desired.

A further aspect includes the calibration logic block performing additional scanning and mathematical operations in order to find an optimal frequency. Furthermore, the calibration logic block can monitor the local oscillating signal continuously and if, for any reason, modify the frequency as necessary.

BRIEF DESCRIPTION OF THE DRAWINGS

FIG. 3b is a more detailed illustration of a virtual ground charge amplifier at the input of an analog channel, and the capacitance contributed by a capacitive touch sensor and seen by the charge amplifier in accordance with one embodiment of the present invention.

FIG. 3c illustrates an exemplary Vstim signal with multiple pulse trains each having a fixed number of pulses, each pulse train having a different frequency Fstim in accordance with one embodiment of the present invention.

DETAILED DESCRIPTION OF THE PREFERRED EMBODIMENT

Figure 1:
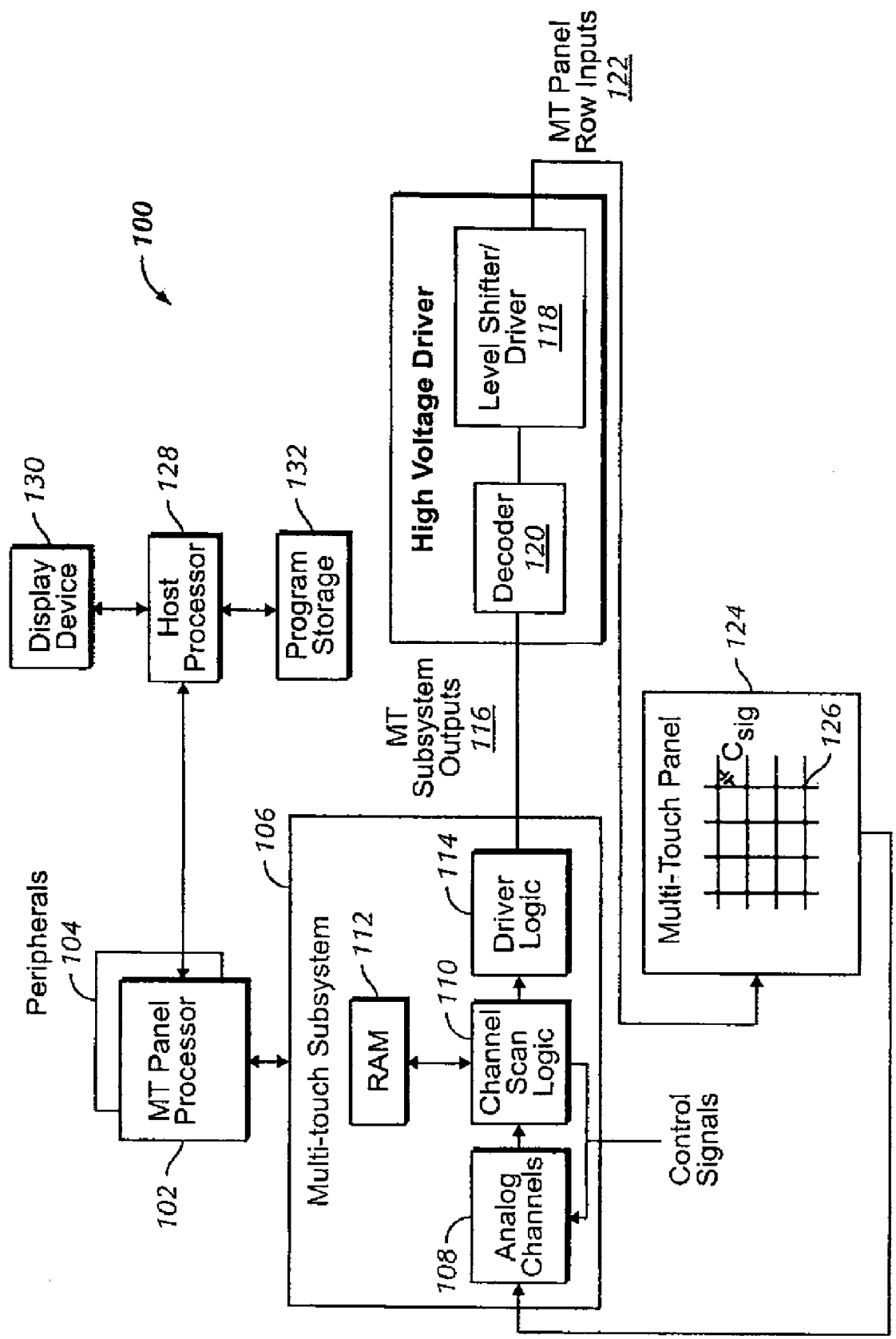
FIG. 1 illustrates an exemplary computing system using a multi-touch panel input device in accordance with one embodiment of the present invention.

In the following description of preferred embodiments, reference is made to the accompanying drawings which form a part hereof, and in which it is shown by way of illustration specific embodiments in which the invention may be practiced. It is to be understood that other embodiments may be used and structural changes may be made without departing from the scope of the preferred embodiments of the present invention.

A plurality of touch sensors in a multi-touch panel can enable a computing system to sense multi-touch events (the touching of fingers or other objects upon a touch-sensitive surface at distinct locations at about the same time) and perform additional functions not previously available with touch sensor devices.

Although some embodiments may be described herein in terms of capacitive touch sensors in a multi-touch panel, it should be understood that embodiments of the invention are not so limited, but are generally applicable to the use of any type of multi-touch sensor technology that may include resistive touch sensors, surface acoustic wave touch sensors, electromagnetic touch sensors, near field imaging touch sensors, and the like. Furthermore, although the touch sensors in the multi-touch panel may be described herein in terms of an orthogonal array of touch sensors having rows and columns, it should be understood that embodiments of the invention are not limited to orthogonal arrays, but may be generally applicable to touch sensors arranged in any number of dimensions and orientations, including diagonal, concentric circle, and three-dimensional and random orientations.

In general, multi-touch panels may be able to detect multiple touches (touch events or contact points) that occur at or about the same time, and identify and track their locations. Examples of multi-touch panels are described in Applicant's co-pending U.S. application Ser. No. 10/842,862 entitled "Multipoint Touchscreen," filed on May 6, 2004 and published as U.S. Published Application No. 2006/0097991 on May 11, 2006, the contents of which are incorporated by reference herein.

It should be understood that although embodiments of this invention are primarily described herein for use with touch sensor panels, proximity sensor panels may also be used to generate modulated output signals for detection by the analog channels. Proximity sensor panels are described in Applicants' concurrently filed U.S. application Ser. No. 11/649,999, filed on Jan. 3, 2007 and entitled "Proximity and Multi-Touch Sensor Detection and Demodulation," the contents of which are incorporated herein by reference.

In view of the above, although this disclosure may describe detecting input in terms of touch-events, it should be understood that the various embodiments disclosed herein may detect near touches or hover-events as well. Accordingly, a touch, a near-touch or a hover may be referred to as an "event" and multiple events that occur at or about the same time may be referred to as a "multi-event."

FIG. 1 illustrates computing system 100 using touch sensors according to one embodiment. Computing system 100 may correspond to computing devices such as desktops, laptops, tablets or handhelds, including personal digital assistants (PDAs), digital music and/or video players and mobile telephones. Computing system 100 may also correspond to public computer systems such as information kiosks, automated teller machines (ATM), point of sale machines (POS), industrial machines, gaming machines, arcade machines, vending machines, airline e-ticket terminals, restaurant reservation terminals, customer service stations, library terminals, learning devices, and the like.

Computing system 100 may include one or more multi-touch panel processors 102 and peripherals 104, and multi-touch subsystem 106. The one or more processors 102 can be ARM968 processors or other processors with similar functionality and capabilities. However, in other embodiments, the multi-touch panel processor functionality may be implemented instead by dedicated logic such as a state machine. Peripherals 104 may include, but are not limited to, random access memory (RAM) or other types of memory or storage, watchdog timers and the like. Multi-touch subsystem 106 may include, but is not limited to, one or more analog channels 108, channel scan logic 110 and driver logic 114. Channel scan logic 110 may access RAM 112, autonomously read data from the analog channels and provide control for the analog channels. This control may include multiplexing columns of multi-touch panel 124 to analog channels 108. In addition, channel scan logic 110 may control the driver logic and stimulation signals being selectively applied to rows of multi-touch panel 124. In some embodiments, multi-touch subsystem 106 may be integrated into a single application specific integrated circuit (ASIC).

Driver logic 114 can provide multiple multi-touch subsystem outputs 116 and can present a proprietary interface that drives high voltage driver, which is comprised of decoder 120 and subsequent level shifter and driver stage 118, although level-shifting functions could be performed before decoder functions. Level shifter and driver 118 can provide level shifting from a low voltage level (e.g. CMOS levels) to a higher voltage level, providing a better signal-to-noise (S/N) ratio for noise reduction purposes. Decoder 120 can decode the drive interface signals to one out of N outputs, whereas N is the maximum number of rows in the panel. Decoder 120 can be used to reduce the number of drive lines needed between the high voltage driver and multi-touch panel 124. Each multi-touch panel row input 122 can drive one or more rows in multi-touch panel 124. In some embodiments, driver 118 and decoder 120 can be integrated into a single ASIC. However, in other embodiments, driver 118 and decoder 120 can be integrated into driver logic 114, and in still other embodiments, driver 118 and decoder 120 can be eliminated entirely.

Multi-touch panel 124 can in some embodiments include a capacitive sensing medium having a plurality of row traces or driving lines and a plurality of column traces or sensing lines, although other sensing media may also be used. The row and column traces may be formed from a transparent conductive medium, such as Indium Tin Oxide (ITO) or Antimony Tin Oxide (ATO), although other transparent and non-transparent materials, such as copper, can also be used. In some embodiments, the row and column traces can be formed on opposite sides of a dielectric material, and can be perpendicular to each other, although in other embodiments other non-orthogonal orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis" as used herein are intended to encompass not only orthogonal grids, but the intersecting traces of other geometric configurations having first and second dimensions (e.g. the concentric and radial lines of a polar-coordinate arrangement). It should also be noted that in other embodiments, the rows and columns can be formed on a single side of a substrate, or can be formed on two separate substrates separated by a dielectric material. In some embodiments, the dielectric material can be transparent, such as glass, or can be formed from other materials, such as mylar. An additional dielectric cover layer may be placed over the row or column traces to strengthen the structure and protect the entire assembly from damage.

At the "intersections" of the traces, where the traces pass above and below each other (but do not make direct electrical contact with each other), the traces essentially form two electrodes (although more than two traces could intersect as well). Each intersection of row and column traces can represent a capacitive sensing node and can be viewed as picture element (pixel) 126, which can be particularly useful when multi-touch panel 124 is viewed as capturing an "image" of touch. (In other words, after multi-touch subsystem 106 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 124 can drive one or more analog channels 108 (also referred to herein as event detection and demodulation circuits) in multi-touch subsystem 106. In some embodiments, each column is coupled to one dedicated analog channel 108. However, in other embodiments, the columns may be couplable via an analog switch to a fewer number of analog channels 108.

Computing system 100 can also include host processor 128 for receiving outputs from multi-touch panel processor 102 and performing actions based on the outputs that may include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 128 may also perform additional functions that may not be related to multi-touch panel processing, and can be coupled to program storage 132 and display device 130 such as an LCD display for providing a user interface (UI) to a user of the device.

Figure 2A:
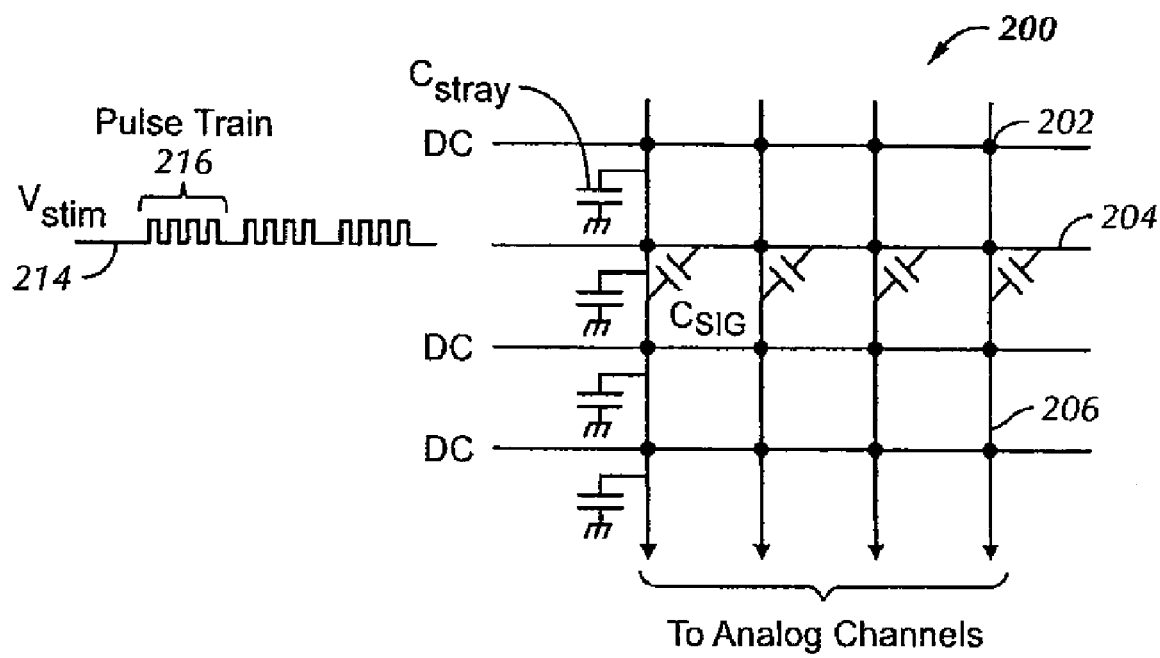
FIG. 2a illustrates an exemplary capacitive multi-touch panel in accordance with one embodiment of the present invention.

FIG. 2a illustrates exemplary capacitive multi-touch panel 200. FIG. 2a indicates the presence of a stray capacitance Cstray at each pixel 202 located at the intersection of a row 204 and a column 206 trace (although Cstray for only one column is illustrated in FIG. 2 for purposes of simplifying the figure). Note that although FIG. 2a illustrates rows 204 and columns 206 as being substantially perpendicular, they need not be so aligned, as described above. In the example of FIG. 2a, AC stimulus Vstim 214 is being applied to one row, with all other rows connected to DC. The stimulus causes a charge to be injected into the column electrodes through mutual capacitance at the intersecting points. This charge is Qsig=Csig×Vstm. Each of columns 206 may be selectively connectable to one or more analog channels (see analog channels 108 in FIG. 1).

Figure 2B:
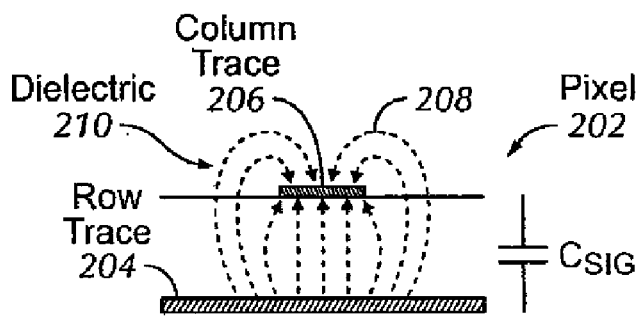
FIG. 2b is a side view of an exemplary capacitive touch sensor or pixel in a steady-state (no-touch) condition in accordance with one embodiment of the present invention.

FIG. 2b is a side view of exemplary pixel 202 in a steady-state (no-touch) condition. In FIG. 2b, an electric field of electric field lines 208 of the mutual capacitance between column 206 and row 204 traces or electrodes separated by dielectric 210 represents a signal capacitance Csig between the row and column electrodes and can cease a charge to be injected form a stimulated row to a column electrode. Since Csig is referenced to virtual ground, it also makes up a stray capacitance. For example, a total stray capacitance of a column electrode can be the sum of all signal capacitances Csig between a given column and all row electrodes. Assuming that CSig is for example 0.75 pF and a column electrode is intersected by fifteen row electrodes, the total stray capacitance on that column electrode would be at least 15×0.75 pF=11.25 pF. In reality, however, the total stray capacitance is likely larger due to a trace stray capacitance of the column electrode to the multi-touch ASIC or other stray capacitances in the system.

Figure 2C:
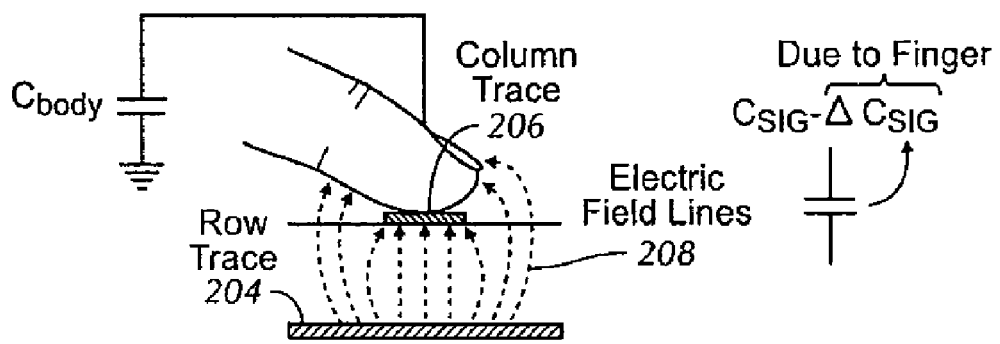
FIG. 2c is a side view of the exemplary capacitive touch sensor or pixel in a dynamic (touch) condition in accordance with one embodiment of the present invention.

FIG. 2c is a side view of exemplary pixel 202 in a dynamic (touch) condition. In FIG. 2c, finger 212 has been placed near pixel 202. Finger 212 is a low-impedance object at signal frequencies, and represents an AC ground return path to via body capacitance Cbody. The body has a self-capacitance to ground Cbody, which is a function of, among other things, body size and geometry. If finger 212 blocks some electric field lines 208 between the row and column electrodes (those fringing fields that exit the dielectric and pass through the air above the row electrode), those electric field lines are shunted to ground through the capacitance path inherent in the finger and the body, and as a result, the steady state signal capacitance Csig is reduced by Csig_sense. In other words, the combined body and finger capacitance act to reduce Csig by an amount ΔCsig (which can also be referred to herein as Csig_sense), and can act as a shunt or dynamic return path to ground, blocking some of the electric fields as resulting in a reduced net signal capacitance. The signal capacitance at the pixel becomes Csig −ΔCsig, where Csig represents the static (no touch) component and ΔCsig represents the dynamic (touch) component. Note that Csig−ΔCsig may always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

Referring again to FIG. 2a, as mentioned above, Vstim signal 214 can be applied to a row in multi-touch panel 200 so that a change in signal capacitance can be detected when a finger, palm or other object is present. Vstim signal 214 can include one or more pulse trains 216 at a particular frequency, with each pulse train including of a number of pulses. Although pulse trains 216 are shown as square waves, other waveshapes such as sine waves can also be employed. A plurality of pulse trains 216 at different frequencies can be transmitted for noise reduction purposes to minimize the effect of any noise sources. Vstim signal 214 essentially injects a charge into the row via signal capacitance Csig, and can be applied to one row of multi-touch panel 200 at a time while all other rows are held at a DC level. However, in other embodiments, the multi-touch panel may be divided into two or more sections, with Vstim signal 214 being simultaneously applied to one row in each section and all other rows in that region section held at a DC voltage.

Each analog channel coupled to a column can provide a result representing a mutual capacitance between a row being stimulated and a column the row is connected to. Specifically, this mutual capacitance is comprised of the signal capacitance Csig and any change Csig_sense in that signal capacitance due to the presence of a finger, palm or other body part or object. These column values provided by the analog channels may be provided in parallel while a single row is being stimulated, or may be provided in series. If all of the values representing the signal capacitances for the columns have been obtained, another row in multi-touch panel 200 can be stimulated with all others held at a DC voltage, and the column signal capacitance measurements can be repeated. Eventually, if Vstim has been applied to all rows, and the signal capacitance values for all columns in all rows have been captured (i.e. the entire multi-touch panel 200 has been "scanned"), a "snapshot" of all pixel values can be obtained for the entire multi-touch panel 200. This snapshot data can be initially saved in the multi-touch subsystem, and later transferred out for interpretation by other devices in the computing system such as the host processor. As multiple snapshots are obtained, saved and interpreted by the computing system, it is possible for multiple touches to be detected, tracked, and used to perform other functions.

Figure 3A:
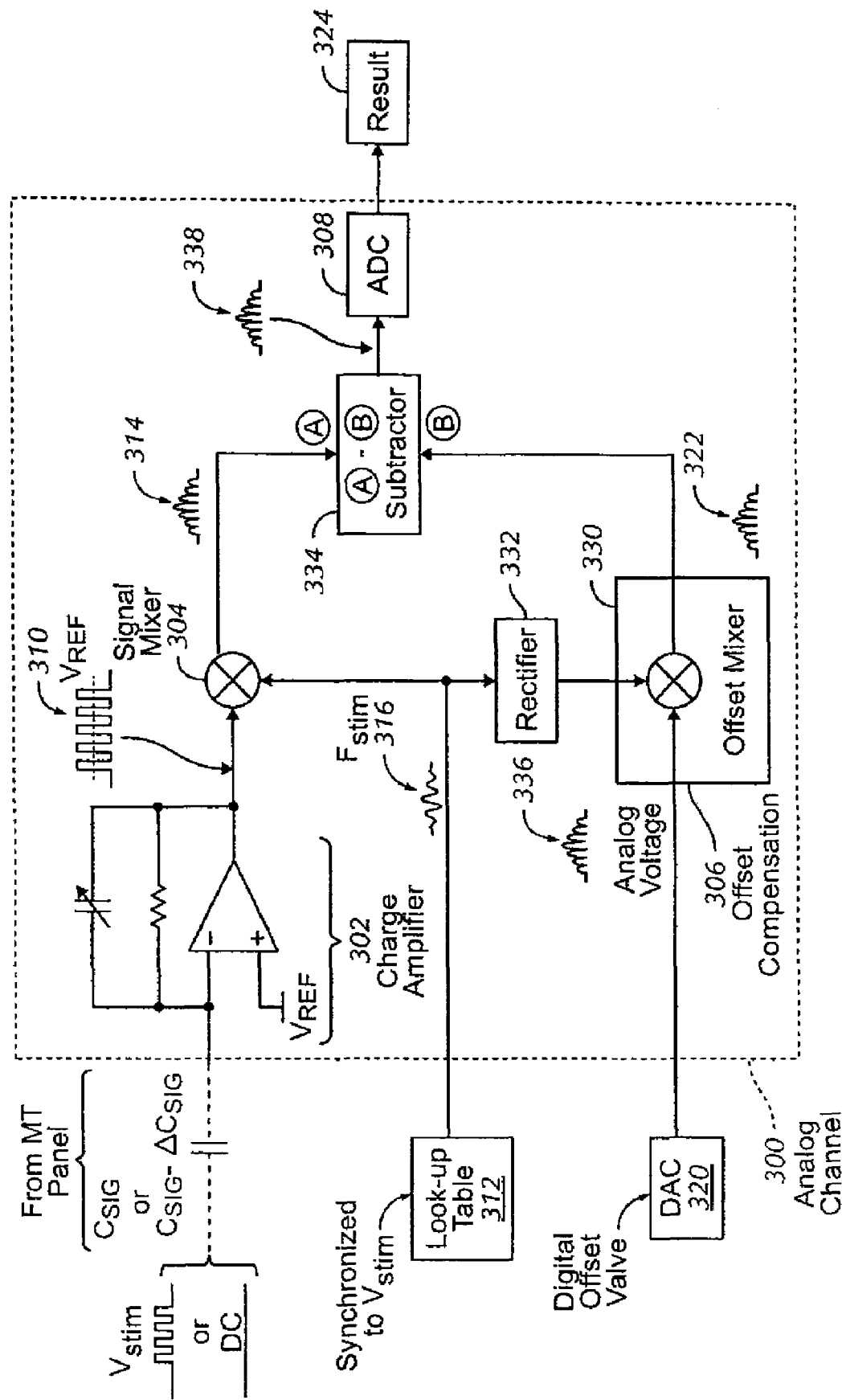
FIG. 3a illustrates an exemplary analog channel in accordance with one embodiment of the present invention.

FIG. 3a illustrates exemplary analog channel or event detection and demodulation circuit 300. One or more analog channels 300 can be present in the multi-touch subsystem. One or more columns from a multi-touch panel can be connectable to each analog channel 300. Each analog channel 300 can include virtual-ground charge amplifier 302, signal mixer 304, offset compensation 306, rectifier 332, subtractor 334, and analog-to-digital converter (ADC) 308. FIG. 3a also shows, in dashed lines, the steady-state signal capacitance Csig that can be contributed by a multi-touch panel column connected to analog channel 300 when an input stimulus Vstim is applied to a row in the multi-touch panel and no finger, palm or other object is present, and the dynamic signal capacitance Csig−ΔCsig that can appear when a finger, palm or other object is present.

Vstim, as applied to a row in the multi-touch panel, can be generated as a burst of square waves or other non-DC signaling in an otherwise DC signal, although in some embodiments the square waves representing Vstim can be preceded and followed by other non-DC signaling. If Vstim is applied to a row and a signal capacitance is present at a column connected to analog channel 300, the output of charge amplifier 302 can be pulse train 310 centered at Vref with a peak-to-peak (p-p) amplitude in the steady-state condition that is a fraction of the p-p amplitude of Vstim, the fraction corresponding to the gain of charge amplifier 302, which is equivalent to the ratio of signal capacitance Csig and preamplifier feedback capacitance Cfb. For example, if Vstim includes 18V p-p pulses and the gain of the charge amplifier is 0.1, then the output of the charge amplifier can be 1.8V p-p pulses. This output can be mixed in signal mixer 304 with demodulation waveform Fstim 316.

Since the stimulation signal can be a square wave, it may be advantageous to use a sinusoidal demodulation waveform to remove the harmonics of the square wave. In order to reduce the stop band ripple of the mixer at a given stimulation frequency, it can be advantageous to use a Gaussian shaped sinewave. The demodulation waveform can have the same frequency as the stimulus Vstim and can be synthesized from a look-up table, enabling generation of any shape of demodulation waveform. Besides Gaussian shaped sinewaves, other waveshapes may be programmed to tune the filter characteristics of the mixers. In some embodiments, Fstim 316 may be tunable in frequency and amplitude by selecting different digital waveforms in the LUT 312 or generating the waveforms differently using other digital logic. Signal mixer 304 may demodulate the output of charge amplifier 310 by subtracting Fstim 316 from the output to provide better noise rejection. Signal mixer 304 may reject all frequencies outside the passband, which may in one example be about +/−30 kHz around Fstim. This noise rejection may be beneficial in noisy environment with many sources of noise, such as 802.11, Bluetooth and the like, all having some characteristic frequency that may interfere with the sensitive (femto-farad level) analog channel 300. Since the frequency of the signals going into the signal mixer can have the same frequency, the signal mixer may be thought of as a synchronous rectifier, such that the output of the signal mixer is essentially a rectified waveform.

Offset compensation 306 can then be applied to signal mixer output 314, which can remove the effect of the static Csig, leaving only the effect of ΔCsig appearing as result 324. Offset compensation 306 can be implemented using offset mixer 330. Offset compensation output 322 can be generated by rectifying Fstim 316 using rectifier 332, and mixing rectifier output 336 with analog voltage from a digital-to-analog converter (DAC) 320 in offset mixer 330. DAC 320 can generate the analog voltage based on a digital value selected to increase the dynamic range of analog channel 300. Offset compensation output 322, which can be proportional to the analog voltage from DAC 320, can then be subtracted from signal mixer output 314 using subtractor 334, producing subtractor output 338 which can be representative of the change in the signal capacitance ΔCsig that occurs when a capacitive sensor on the row being stimulated has been touched. Subtractor output 338 is then integrated and can then be converted to a digital value by ADC 308. In some embodiments, integrator and ADC functions are combined and ADC 308 may be an integrating ADC, such as a sigma-delta ADC, which can sum a number of consecutive digital values and average them to generate result 324.

FIG. 3b is a more detailed view of charge amplifier (a virtual ground amplifier) 302 at the input of an analog channel, and the capacitance that can be contributed by the multi-touch panel (see dashed lines) and seen by the charge amplifier. As mentioned above, there can be an inherent stray capacitance Cstray at each pixel on the multi-touch panel. In virtual ground amplifier 302, with the +(non-inverting) input tied to Vref, the −(inverting) input is also driven to Vref, and a DC operating point is established. Therefore, regardless of how much Csig is present, the −input is always driven to Vref. Because of the characteristics of virtual ground amplifier 302, any charge Qstray that is stored in Cstray is constant, because the voltage across Cstray is kept constant by the charge amplifier. Therefore, no matter how much stray capacitance Cstray is added to the −input, the net charge into Cstray will always be zero. Accordingly, the input charge Qsig_sense=(Csig−ΔCsig_sense)Vstim is zero when the corresponding row is kept at DC and is purely a function of Csig and Vstim when the corresponding row is stimulated. In either case, because there is no charge across Csig, the stray capacitance is rejected, and it essentially drops out of any equations. Thus, even with a hand over the multi-touch panel, although Cstray can increase, the output will be unaffected by the change in Cstray.

The gain of virtual ground amplifier 302 is usually small (e.g. 0.1) and is equivalent to the ratio of Csig (e.g. 2 pF) and feedback capacitor Cfb (e.g. 20 pF). The adjustable feedback capacitor Cfb converts the charge Qsig to the voltage Vout. Therefore, the output Vout of virtual ground amplifier 302 is a voltage that is equivalent to the ratio of −Csig/Cfb multiplied by Vstim referenced to Vref. The high voltage Vstim pulses can therefore appear at the output of virtual ground amplifier 302 as much smaller pulses having an amplitude identified by reference character 326. However, when a finger is present, the amplitude of the output can be reduced as identified by reference character 328, because the signal capacitance is reduced by ΔCsig.

FIG. 3c illustrates an exemplary stimulation signal Vstim with multiple pulse trains 330a, 330b, 330c, each of which have a fixed number of pulses, but have a different frequency Fstim (e.g., 140 kHz, 200 kHz, and 260 kHz). With multiple pulse trains at different frequencies, a different result may be obtained at each frequency. Thus, if a static interference is present at a particular frequency, the results of a signal at that frequency may be corrupted as compared to the results obtained from signals having other frequencies. The corrupted result or results can be eliminated and the remaining results used to compute a final result or, alternatively, all of the results may be used.

As mentioned above, multi-touch system 100 has various frequency sensitive circuits and electrics elements, such as sensor nodes 126, many of which may require an accurate frequency signal to operate correctly. Accordingly, in one embodiment, a calibration system is incorporated into multi-touch system 100 to calibrate a clock source so as to ensure acceptable performance.

Figure 4:
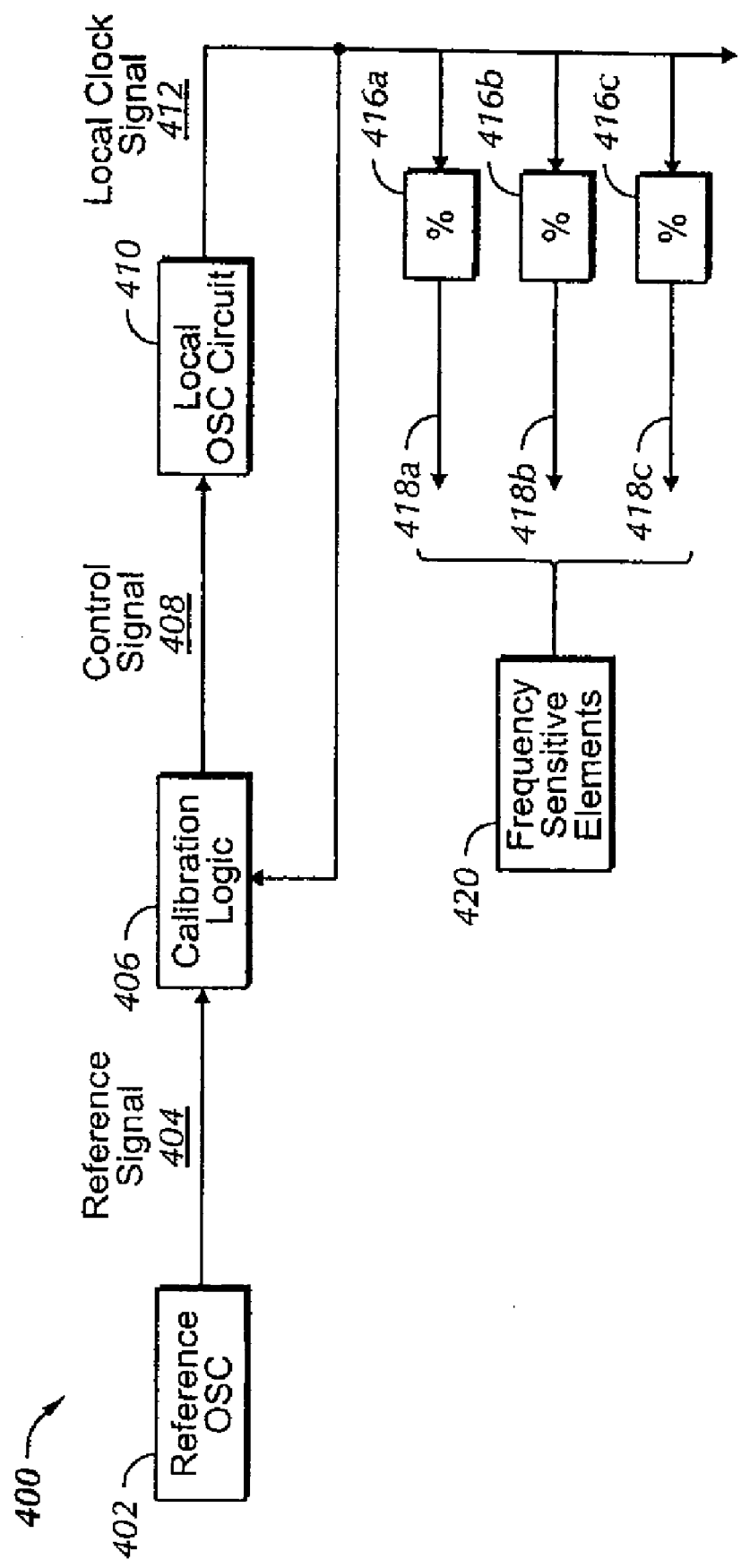
FIG. 4 is a block diagram illustrating a calibration system according to one embodiment of this invention.

Calibration system 400 in accordance with of one exemplary embodiment of the present invention is illustrated in the block diagram of in FIG. 4. Clock signal calibration system 400 can include reference oscillator 402 producing reference signal 404. Reference oscillator 402 can be a stable clock source that generates a known frequency. In one embodiment, reference oscillator 402 can be a crystal oscillator producing a low frequency signal of about 32 kHz. Crystal oscillators can be desirable because they can operate at low power levels and do not need to be phase lock looped to an external clock source. Reference oscillator 402 can reside in multi-touch subsystem 106 or externally from multi-touch subsystem 106, such as in multi-touch panel processor block 102 or host processor block 128.

With further reference to FIG. 4, calibration logic block 406 can receive reference signal 404 and generate control signal 408. Calibration logic block 406 can monitor local signal 412 and modify control output signal 408 to, in turn, cause the local signal 412 to have an optimal or desired value. Thus, calibration logic block 406 can effectively tune the frequency of the oscillating current 412 in order to obtain an optimal or acceptable value, and thus an optimal or acceptable operation mode of the device in which the embodiment of the present invention is used.

Once reference signal 404 is present, calibration logic block 406 can be turned on to initiate a calibration sequence. In general, calibration block 406 can function to calibrate local oscillator 410 so that local oscillator 410 generates local clock signal 412 having a desired frequency. Local signal 410 can be fed back into calibration logic 406 for tuning local oscillator 410, as is discussed in further detail below.

In one embodiment, calibration logic block 406 can comprise a state machine. A state machine can comprise logic circuitry formed using any one of a plurality of designs and technologies, including ASIC designs, field programmable gate array designs and general purpose processor technology whose operational logic is defined by software. In general, however, a state machine can be formed to define operational logic to carry out the functions described herein.

In addition, local signal 412 can be used to clock and power various circuits and electronic elements of a multi-touch system 100. Clock dividers 416a, 416b, and 416c can be used to further modify local signal 412 into divided signals 418a, 418b and 418c, respectively. The divided signals 418a, 418b and 418c can be similarly used to clock various frequency sensitive elements 420. A frequency sensitive element can include a multi-touch sensor 126. The example of FIG. 4 shows three clock dividers, but a different number of dividers can be used as needed.

In one embodiment, calibration logic 406 can use a binary search algorithm to calibrate local oscillator 410. In general, a binary search is a technique for finding a particular value in a linear array by ruling out half of the remaining data at each step. A binary search finds a median, makes a comparison to determine whether the desired value comes before or after the median, and then searches the remaining half in the same manner. Advantageously, a binary search is logarithmic and typically executes in less time and uses less iteration than a linear search. For example, when searching for an integer number between a range of 1 and 128, a seven bit binary search algorithm can find the number in seven iterations; in other words, one iteration per bit. In contrast, a linear search (e.g., stepping from 1 to 2 to 3 and so on) can take as many as 128 iterations.

A person of skill in the art would recognize that different embodiments can change the overall layout of the above discussed circuit 400 while preserving essentially the same function. For example, in one embodiment, local oscillator block 410 includes a voltage controlled oscillator. Varying the frequency of the voltage controlled oscillator can be accomplished by changing a digital signal applied to a digital-to-analog converter, which thereafter changes the voltage applied across the voltage controlled oscillator, as is recognized by those of ordinary skill in the art. In another embodiment, local oscillator 410 can be an n-stage ring oscillator. As is known, a tune value, such as from calibration logic 406, can be applied to an n-stage ring oscillator to change the high frequency output. In view of the above, persons of skill in the art will recognize that there are many alternate ways to vary the frequency of local signal 412.

Figure 5A:
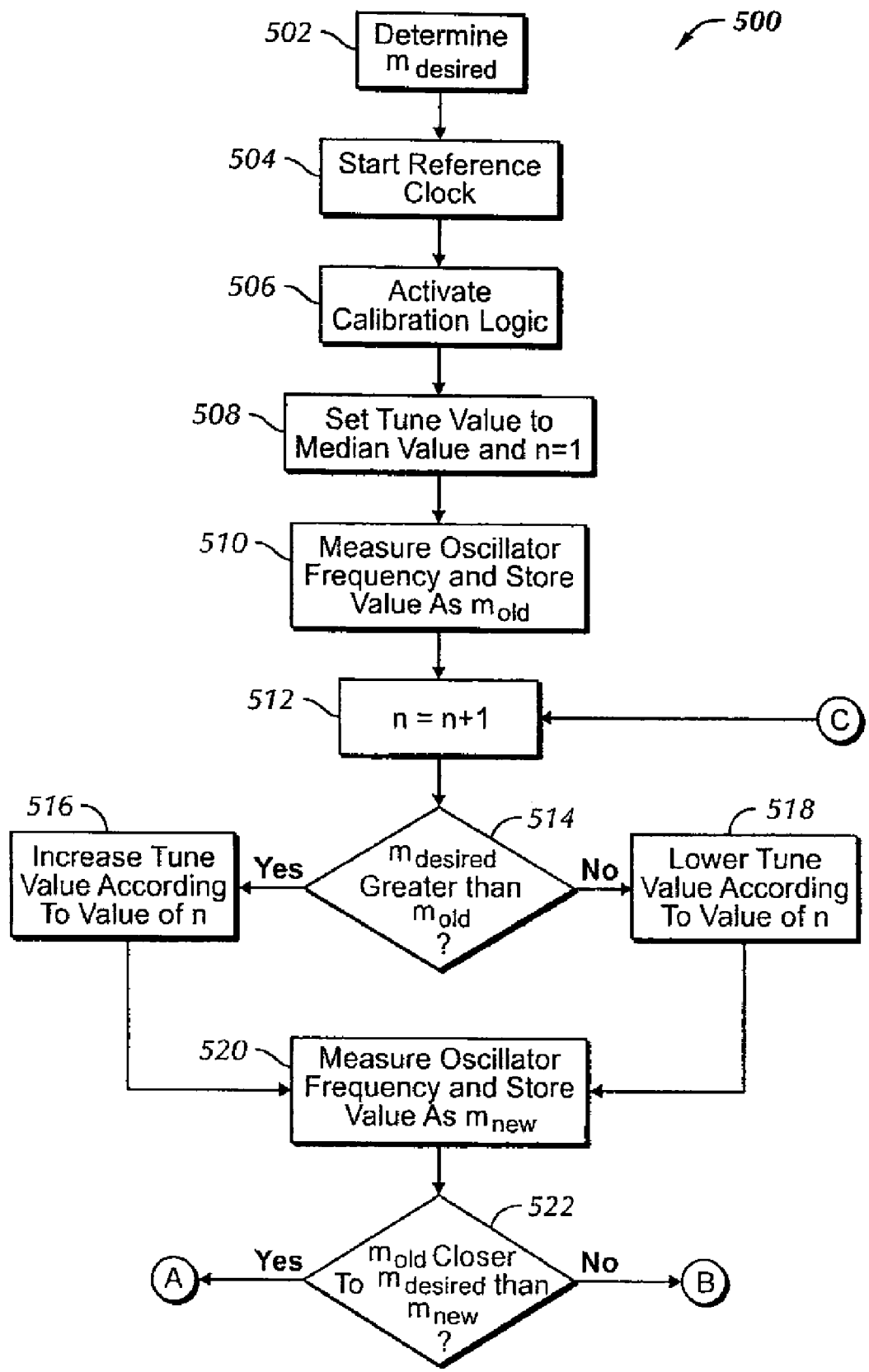
FIG. 5A-B is a flowchart illustrating operation of calibration logic tuning a local oscillator in accordance with one embodiment of the present invention.
Figure 5B:
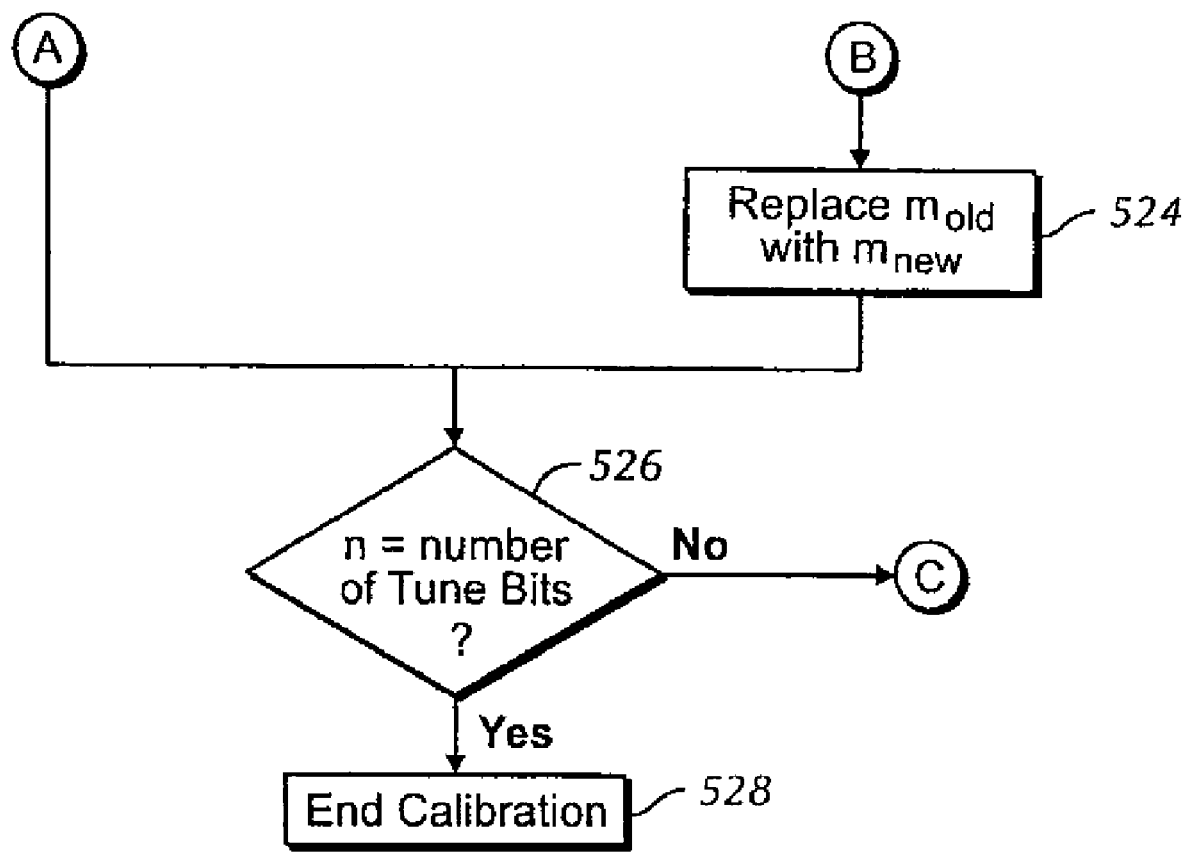

An exemplary tuning process 500 of local oscillator 410 using a binary search algorithm is illustrated in the flowchart of FIG. 5. One skilled in the art will appreciate that various timing and memory storage issues are omitted from this flowchart for the sake of clarity.

The process 500 starts at block 502. Here, a desired frequency at which local oscillator 410 is to be operated is determined. This can be done by calculating the number of cycles ($m_{desired}$) a desired frequency would have in one cycle of a reference signal. Specifically, the desired number of cycles $m_{desired}$ that are counted in one cycle of a reference signal correlates to the desired frequency. Thus, for example, if $m_{desired}$ equals 6875 (e.g., local oscillator signal 412 has 6875 cycles in one cycle of reference signal 404) and reference signal 404 has a frequency of 32 kHz, then the desired frequency of local oscillator signal 410 is 6875×32 kHz=220

MHz. In other words, $m_{desired}$ can be calculated by dividing the desired frequency of local oscillator 410 by the frequency of reference signal 404.

In one embodiment, a programmable value m can be used to set a range of available frequencies. The available frequencies can be determined by multiplying the maximum value of the programmable value m by the reference signal frequency. Thus, if the programmable value m is a thirteen bit value and the reference frequency is 32 kHz, then the range of available frequencies can be from 32 kHz (m having its decimal value of 1) to 262 MHz (m having a decimal value of 8191).

In an alternative embodiment, the programmable value m is multiplied by a granularity factor to achieve the desired frequency or corresponding $m_{desired}$. This may be desirable to reduce the number of bits needed in the programmable value m, which can be particularly advantageous when $m_{desired}$ does not need to be defined with much more precision than the precision associated with the tuning value. To illustrate, an $m_{desired}$ value of 6875 (corresponding to about 220 Mz when reference signal is 32 kHz) can be generated by multiplying an eight bit programmable value by a granularity factor of 32. The eight bit programmable value was chosen because it can provide enough precision in combination with a seven bit tuning value. Of course, the programmable value m can have more or fewer bits as desired. Furthermore, in this example, the granularity factor was determined by calculating 2 (because binary value) to the power of a value equal to the number of fewer bits used. In other words, since five fewer bits are used when using an eight bit value instead of a thirteen bit value, the granularity factor can be calculated as $2^5=32$. As can be appreciated, the above is a non-limiting example and other methods of generating a frequency can be used.

Referring again to FIG. 5, calibration logic 406 can be activated in block 504. In one embodiment, activating reference signal 404 causes calibration logic 406 to be activated (block 506) and discontinuing the reference signal 404 causes calibration logic 406 to be deactivated.

In block 508, the tune value is set to a mid point value and an incremental value n is set to 1. For example, if seven tuning bits are used to calibrate local oscillator 410, the mid point value is 64 (i.e., 1000000 in binary). In one embodiment, local oscillator 410 is initially manufactured to output a signal having a desired frequency (e.g., 220 MHz) when control signal 408 is set at the mid point value. However, the output frequencies of most voltage controlled oscillators cannot be exactly predicted as they are subject to process variation among other things. As a result, a voltage controlled oscillator may need to be tuned so that its actual output frequency is close to the desired output frequency. Accordingly, further tuning of local oscillator 410 can be done using tuning process 500.

Of note, a different number of tuning bits can be used to obtain a desired degree of tuning precision. Specifically, the more tuning bits used, the greater the precision. However, using more tuning bits can increase the time to perform the calibration as well as add area to the calibration circuitry. Thus, a larger number of tuning bits can increase cost (e.g., more area and circuitry) as well as power consumption. In one embodiment, the number of tuning bits that achieves sufficient precision is seven bits.

Figure 6:
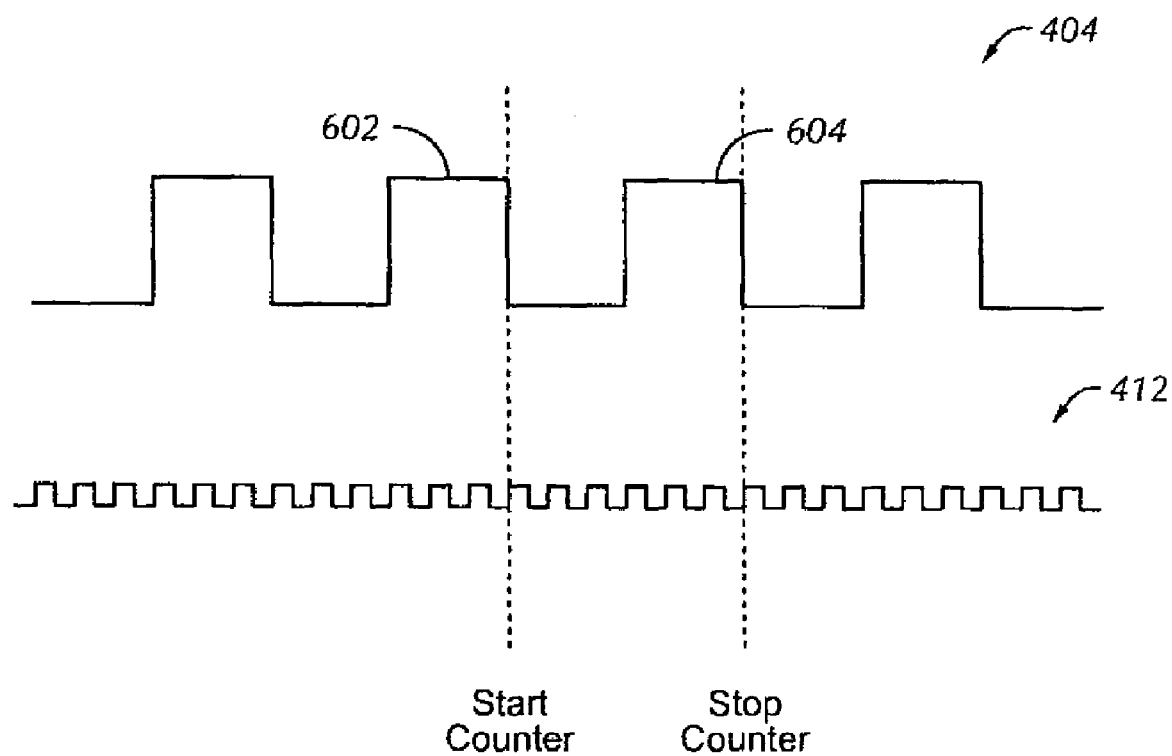
FIG. 6 is a timing sequence for counting cycles of a local oscillating signal in accordance with one embodiment of the present invention.

Referring back to FIG. 5, in block 510 the tune value (which is initially set at the mid point value) is applied to local oscillator 410 and the resulting frequency of local oscillator 410 is measured. The measured frequency is then stored as a value referred to as $m_{old}$. FIG. 6 illustrates measuring a local oscillator frequency in accordance with one embodiment. A clock counter (not shown) is activated and starts counting cycles of a local oscillator signal 412 at a first falling edge of reference signal 404. The counter then stops counting the cycles of local signal 412 at a next falling edge (i.e., after one cycle of reference signal 404). The result of the counter can then be stored in a dedicated register located in calibration logic block 406. As can be appreciated, this is only one of a number of different implementations that can be used to measure the frequency of a local oscillator. For example, in another embodiment, the counter is activated at a first rising edge and deactivated at a next rising edge.

Next, in block 512, the incremented value n is increased by one integer (i.e., n=n+1). In one embodiment, the maximum value of the incremented value n corresponds to the number of tune bits. Moreover, each time a frequency measurement is taken, n is incremented one integer. As will be described in more detail below, the value n also determines the amount a tune value is changed as well as when calibration process 500 is done.

The value $m_{desired}$ is then compared to the stored value $m_{old}$ in block 514. Here, if $m_{desired}$ is greater than $m_{old}$, then the local oscillator frequency is increased in block 516. On the other hand, the local oscillator frequency is lowered in block 518 if $m_{desired}$ is less than $m_{old}$.

Further to block 516, the local oscillator frequency can be increased by increasing the tune value. In accordance with a binary search algorithm, this can be done by adding the current tune value to the mid point value divided by the twice the number of times a measurement has been taken (i.e., the current value of n). In other words:

new tune value=current tune value+(mid point value)/(2×n)

As an example, if the mid point value has a decimal value of 64 and only one measurement has been taken (i.e., n=1), then the tune value is increased to 64+64/(2×1)=96. As a further example, if the tune value is 96 and two measurements have been taken (n=2), then the tune value can be increased to 96+64/(2×2)=112.

Figure 7:
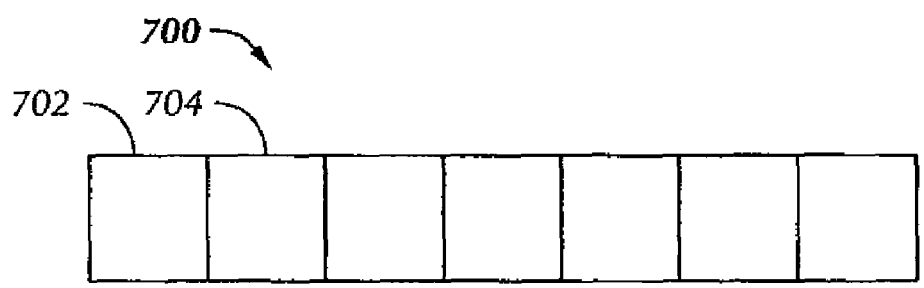
FIG. 7 depicts a seven bit binary tune value in accordance with one embodiment of the present invention.

Described another way using binary values, when increasing the tune value in step 516, the most recently changed bit is kept the same and the next most significant bit, which has a binary position corresponding to the current value of n, is changed to a value of "1". To illustrate, FIG. 7 shows a seven bit binary register 700. The most significant bit is first position bit 702. First position bit 702 is initially set to a "1" value and the remaining bits are set to "0" values to obtain the mid point tune value in block 508. If $m_{desired}$ is then determined to be greater than $m_{old}$ in block 514, then first position bit 702 remains a "1" value and the next most significant (i.e., second position bit 704) is changed to a "1" value. This increases the tune value as mentioned above. As another example, if several measurements have already been taken so that n=3, then second position bit 704 remains a "1" and the next most significant bit (in third position) is changed to a "1" value to increase the tune value.

Further to block 518, the local oscillator frequency can be lowered by lowering the tune value. Here, instead of adding a value to the tune value as was done in block 516, the tune value is subtracted by a value equal to the mid point value divided by twice the value of n. In other words:

new tune value=current tune value−(mid point value)/(2×n)

For example, if the mid point value has a decimal value of 64 and only one measurement has been taken (i.e., n=1), then the tune value is decreased to 64−64/(2×1)=32. As another example, if the tune value is 96 and two measurements have been taken (n=2), then the new tune value is decreased to 96−64/(2×2)=80.

Described another way in binary value, the most recently changed bit is changed to a "0" value and the next most significant bit, which has a position corresponding to the current value of n, is changed to a "1" value when decreasing the tune value. Referring back to the example of FIG. 7, first position bit 702 can be initially set to a "1" value to obtain the mid point tune value. If $m_{desired}$ is determined to be less than $m_{old}$ in block 514, then first position bit 702 is changed to a "0" value and the next most significant (i.e., second position bit 704) is changed to a "1" value. This decreases the tune value as mentioned above. As a further example, if n=3 and it is determined that $m_{desired}$ is to be less than $m_{old}$ in block 514, then second position bit 704 can be changed to a "0" value and the next most significant bit (i.e. the bit in third position) can be changed to a "1" value.

After the tune value is changed in either block 516 or block 518, the new tune value is applied to local oscillator 410 and the resulting oscillation frequency can be measured in block 520. In one embodiment, this measurement can be performed in a similar manner as the measurement described with reference to block 510. A resulting value from this measurement can then be stored as $m_{new}$.

Next, the absolute values of $m_{old}$ and $m_{new}$ can be compared to determine which value is closer to $m_{desired}$ in block 522. If $m_{old}$ is closer, then calibration process 500 proceeds to block 526. On the other hand, $m_{old}$ is replaced with the $m_{new}$ value in block 524 if $m_{new}$ is closer to $m_{desired}$.

In block 526, the incremented value n is compared with the total number of tune bits. If the incremented value is less than the number of tune bits, then the calibration process returns to block 512. If the numbers are the same, then the calibration process 500 is done in block 528. When done, reference signal 404 can be discontinued and calibration logic 406 can be turned off.

As can be appreciated, the accuracy of tuning process 500 is related to the number of tune bits used. Specifically, the accuracy is $\frac{1}{2}^n$ where n is the number of tune bits used. Thus, when 7 tune bits are used, the accuracy corresponds to plus or minus 0.4%.

Calibration logic 406 can perform calibration process 500 at the time of applying power to a device which incorporates embodiments of this invention. Thereafter, the tuned local oscillation frequency can be set and not changed until a reset of the device.

In an exemplarily embodiment, calibration logic 406 can perform tuning constantly or periodically. This can be useful because the optimal frequency of oscillating signal 412 can change as device components age, as the operating environment of the device (e.g. temperature, humidity) changes, or for other reasons. Thus, by periodically performing frequency tuning, calibration logic 406 can keep the device in optimal operation by dynamically modifying the device's frequency.

Figure 8:
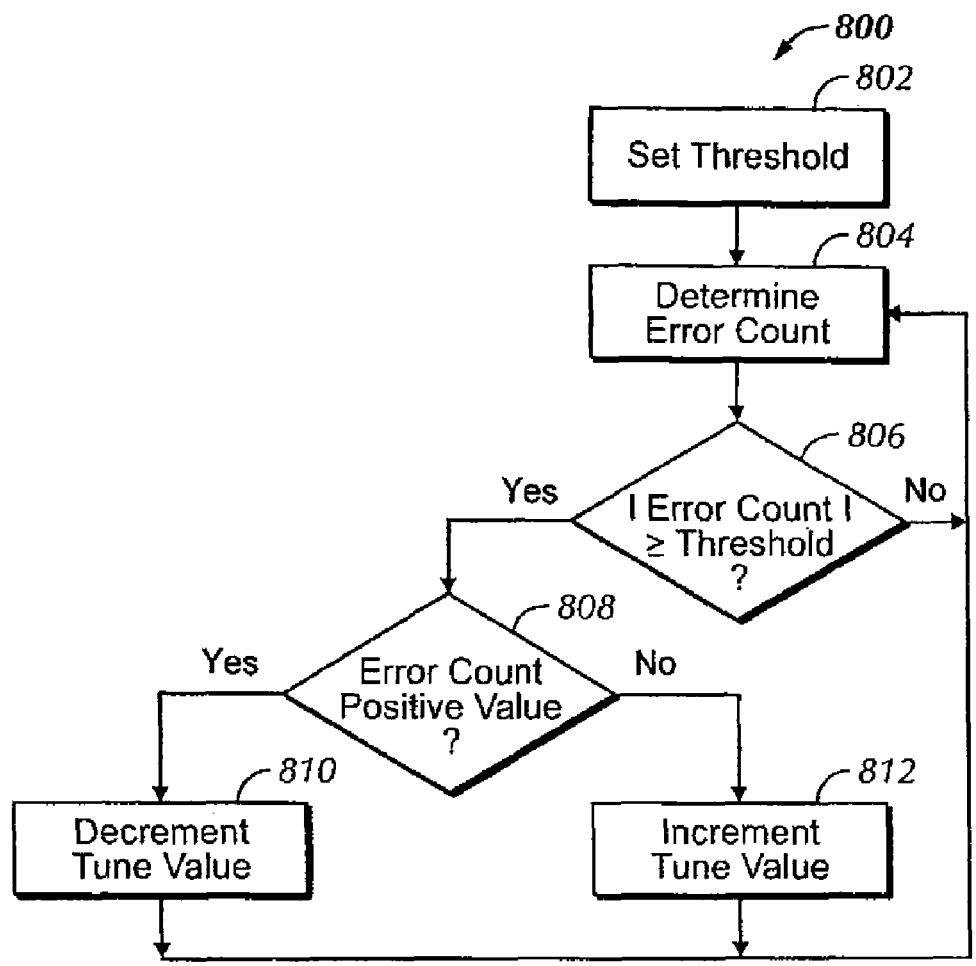
FIG. 8 is a flowchart illustrating operation of calibration logic constantly calibrating a local oscillator in accordance with one embodiment of the present invention.

FIG. 8 is a logic flow diagram showing an optional recalibration and tuning process 800 in accordance with an exemplary embodiment of the present invention. Process 800 can be performed after an initial calibration and tuning of local oscillator 410, such as process 500 described with reference to FIG. 5. Process 800 can be desirable for maintaining the frequency of local oscillator 410 (FIG. 4) within a desired range.

To start, a threshold can be defined in block 802. The threshold can correlate to an acceptable amount of variation in local oscillator 410. Described another way, the threshold can define an acceptable range of error. If the frequency of local oscillator 410 falls within an acceptable range, then local oscillator 410 need not be re-tuned. On the other hand, if the frequency falls outside of the acceptable range, then local oscillator 410 can be re-tuned in order to obtain an optimal or acceptable frequency, and thus an optimal or acceptable operation mode of the device in which the present invention is used.

In accordance with various embodiments, the threshold can be a programmable value having, for example, a nine bit value. Moreover, several factors can be considered when selecting a threshold value. For example, it may be desirable to select a threshold that is large enough so that insignificant random fluctuations in local oscillator 410 do not trigger re-tuning. On the other hand, if the threshold is defined so low that random fluctuations are caught, then local oscillator 410 may undesirably fall into a constant dither mode. It may also be desirable to select a threshold that is small enough so that local oscillator 410 can be appropriately re-tuned when external factors, such as temperature changes, cause the frequency of local oscillator 410 to change beyond a desirable level.

With further reference to FIG. 8, an error count can be determined in block 804. In one embodiment, an error count can be determined by measuring the number of local oscillator 410 cycles that occur within a single reference oscillator 402 cycle (corresponding to $m_{measured}$ described with reference to FIG. 5) and subtracting that number from a desired number of counts corresponding to the desired frequency (corresponding to $m_{desired}$ described with reference to FIG. 5). In other words, an error count can be calculated as follows:

$$\text{Error count} = (m_{measured}) - (m_{desired})$$

Next, an absolute value of the error count can be compared to the threshold value in decision block 806. If the absolute value of the error count is less than the threshold, then this can mean any variation in local oscillator 410, which may have occurred, falls within an acceptable range and, therefore, re-tuning of local oscillator 410 needed not be performed. Process 800 can then return to block 804. If the absolute value of the error count is greater than the threshold, however, then this can indicate variation in local oscillator 410 falls outside of an acceptable range and re-tuning of the clock can be performed. When this occurs, process 800 can proceed to block 808.

In decision block 808, process 800 can determine if the error count is positive. A positive error count can mean that the frequency of local oscillator 410 is greater than the desired frequency, $m_{desired}$. Accordingly, the tune value can be decremented in block 810 in order to decrease the frequency of local oscillator 410. On the other hand, a negative error count can mean the frequency of the high-frequency clock is less than the desired frequency, $m_{desired}$. Thus, the tune value can be incremented in order to increase the frequency of local oscillator 410. In accordance with various embodiments, the tune value can be incremented or decremented by one bit in block 810 and block 812, respectively. As can be appreciated, the process 800 may need to be repeated numerous times before local oscillator 410 is re-tuned so that it produces a frequency that falls within an optimal or acceptable range; particularly if the frequency of local oscillator 410 changed by a significant amount. However, this need not be a problem because the process 800 can be performed constantly or frequently so that local oscillator 410 is quickly re-tuned to fall within an acceptable range.

In accordance with an exemplarily embodiment, logic for performing process 800 can reside in calibration logic block 406, which is described in further detail with reference to FIG. 4. Advantageously, implementation of process 800 need not require additional hardware than what is used to implement process 500. Instead, reprogramming may be all that is needed implement both process 500 and process 800. Of course, a person of skill in the art would recognize that different embodiments can change the overall layout while preserving essentially the same function.

Figure 9:
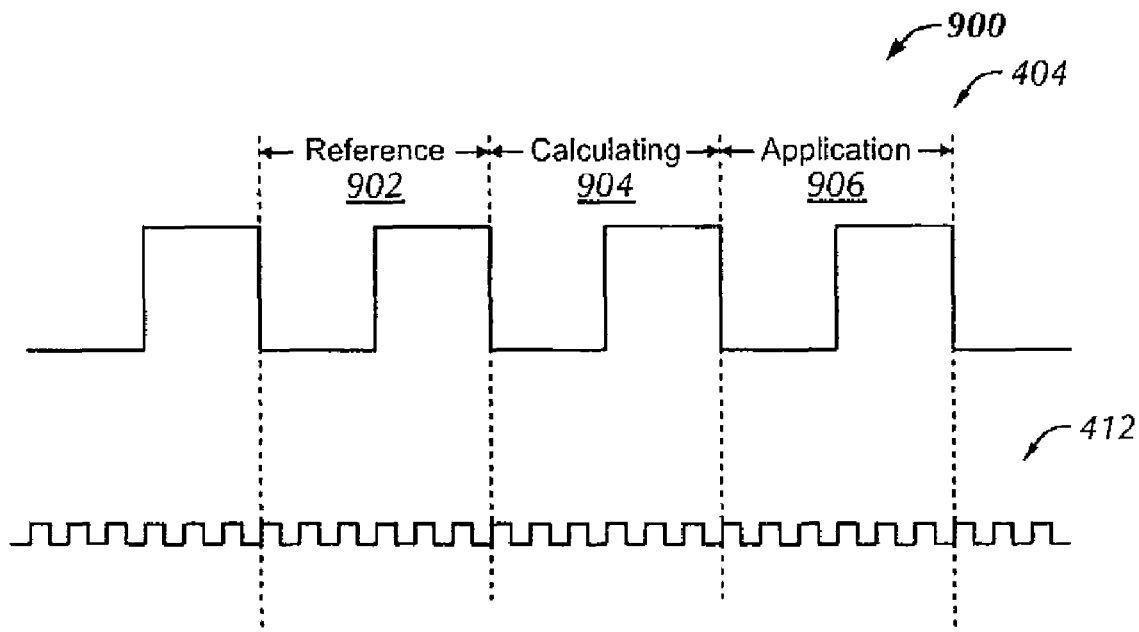
FIG. 9 is a timing sequence for constant calibration of a local oscillating signal in accordance with one embodiment of the present invention.

FIG. 9 illustrates a timing sequence 900 that can be used for implementing process 800 in accordance with an exemplary embodiment of the present invention. As illustrated, determining an error count (corresponding to block 804) can occur during reference cycle 902. Comparing the error count with a threshold (corresponding to block 806) and determining whether the error count is positive if the threshold is exceeded (corresponding to block 808) can occur during calculating cycle 904. In addition, incrementing (corresponding to block 810) or decrementing (corresponding to block 812) can occur, if needed, during application cycle 906. FIG. 9 shows each cycle 902, 204 and 906 beginning and ending at falling edges of reference signal 404; however, a person of skill in the art would recognize that different implementations can be used while preserving essentially the same function.

While performing process 900, reference oscillator 402 can remain on. This allows for a constant recalibration of local oscillator 410. As can be appreciated, however, reference oscillator 402 may be turned off when a precise local frequency is not needed, thereby conserving power.

Figure 10:
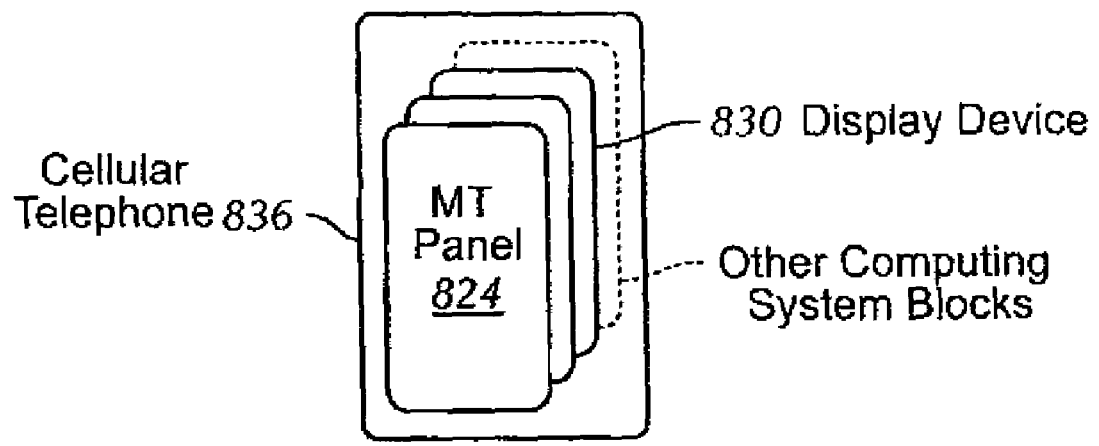
FIG. 10 illustrates an exemplary mobile telephone that may include multi-touch panel, proximity sensors, display device, and other computing system blocks in accordance with one embodiment of the present invention.

FIG. 10 illustrates an exemplary mobile (e.g., cellular) telephone 836 that may include multi-touch panel 824, display device 830, and other computing system blocks in the computing system 100 of FIG. 1. In the example of FIG. 10, if a user's cheek or ear is detected by one or more multi-touch panel sensors, computing system 100 may determine that mobile telephone 836 is being held up to the user's head, and therefore some or all of multi-touch subsystem 106 and multi-touch panel 124 may be powered down along with display device 130 to save power.

Figure 11:
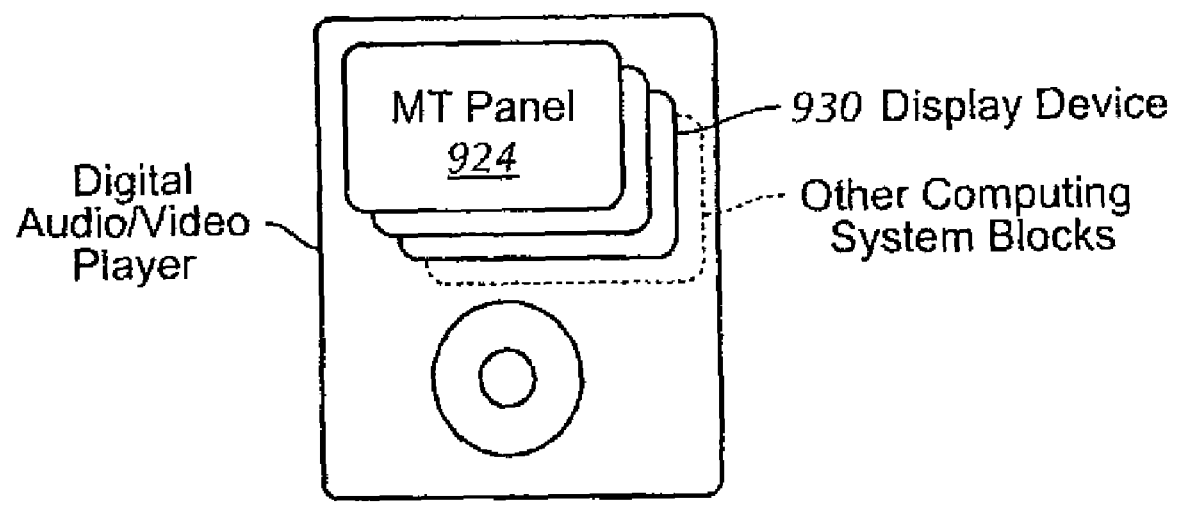
FIG. 11 illustrates an exemplary digital audio/video player that may include a multi-touch panel, proximity sensors, a display device, and other computing system blocks in accordance with one embodiment of the present invention.

FIG. 11 illustrates an exemplary digital audio/video player that may include multi-touch panel 924, display device 930, and other computing system blocks in the computing system 100 of FIG. 1.

While this invention has been described in terms of several preferred embodiments, there are alterations, permutations, and equivalents, which fall within the scope of this invention. For example, the term "computer" does not necessarily mean any particular kind of device, combination of hardware and/or software, nor should it be considered restricted to either a multi purpose or single purpose device. Additionally, although the embodiments herein have been described in relation to touch screens, the teachings of the present invention are equally applicable to touch pads or any other type of sensor panel that detects a touch or near touch at the sensor panel.

For example, although embodiments of this invention are primarily described herein for use with touch sensor panels, proximity sensor panels, which sense "hover" events or conditions, may also be used to generate modulated output signals for detection by the analog channels. Proximity sensor panels are described in Applicants' co-pending U.S. application Ser. No. 11/649,999, filed on Jan. 3, 2007 and entitled "Proximity and Multi-Touch Sensor Detection and Demodulation," the contents of which are hereby incorporated herein by reference in their entirety. As used herein, "touch" events or conditions should be construed to encompass "hover" events and conditions and may collectively be referred to as "events." Also, "touch surface panels" should be construed to encompass "proximity sensor panels."

Furthermore, although the disclosure is primarily directed at capacitive sensing, it should be noted that some or all of the features described herein may be applied to other sensing methodologies. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for tuning an oscillator of an event-sensitive device, comprising:
programmably configuring calibration logic to perform a first calibration process to initially tune the oscillator to a desired frequency, the first calibration process including
approximating a number of cycles of the desired frequency in one cycle of a reference signal by multiplying a programmable value and a granularity factor, the granularity factor for reducing a number of bits in the programmable value while maintaining a reduced but sufficient precision in the approximated number of cycles, and
iteratively adjusting an oscillator tuning value in accordance with a difference between a number of cycles of a measured oscillator frequency in one cycle of the reference signal and the approximated number of cycles; and
programmably reconfiguring the calibration logic to perform a second calibration process to maintain the oscillator at the desired frequency, the second calibration process including
initiating the second calibration process on a periodic basis by activating the reference signal, the initiation being independent of any detected frequency drift,
setting a threshold value corresponding to an acceptable frequency variation range,
determining an error count corresponding to a difference between the measured oscillator frequency and an approximated frequency associated with the approximated number of cycles,
determining if the error count exceeds the threshold value,
tuning the oscillator to a frequency that is closer to the approximated frequency if the error count exceeds the threshold value, and
discontinuing the second calibration process by deactivating the reference signal to conserve power during normal operation.

2. The method of claim 1, the first calibration process comprising:
initiating the first calibration process by activating the reference signal;
performing a binary search algorithm on the oscillator tuning value to iteratively tune the oscillator to the approximated frequency; and
deactivating the first calibration process by discontinuing the reference signal.

3. The method of claim 1, further comprising counting a number of cycles of the measured oscillator frequency in one cycle of the reference signal to determine the number of cycles of the measured oscillator frequency, the counting comprising starting a counter upon occurrence of a first event of the reference signal and stopping the counter upon occurrence of a second event of the reference signal.

4. The method of claim 3, wherein the first event is a first rising edge of the reference signal and the second event is a second rising edge of the reference signal.

5. The method of claim 3, further comprising storing the number of cycles counted in a memory unit.

6. The method of claim 1, wherein determining the error count comprises:
   counting a number of clock cycles of the measured oscillator frequency during one cycle of the reference signal; and
   determining a difference between the counted number of clock cycles and the approximated number of clock cycles.

7. The method of claim 6, further comprising tuning the oscillator to a lower frequency when the number of cycles counted is more than the approximated number of cycles.

8. A method for tuning a frequency of an oscillating signal comprising:
   programmably configuring calibration logic to perform a first calibration process to initially tune the oscillating signal to a desired frequency, the first calibration process including
      approximating a number of cycles of the desired frequency in one cycle of a reference signal by multiplying a programmable value and a granularity factor, the granularity factor for reducing a number of bits in the programmable value while maintaining a reduced but sufficient precision in the approximated number of cycles, and
      iteratively adjusting an oscillator tuning value in accordance with a difference between a number of cycles of a measured oscillator frequency in one cycle of the reference signal and the approximated number of cycles; and
   programmably reconfiguring the calibration logic to perform a second calibration process to maintain the oscillating signal at the desired frequency, the second calibration process including
      initiating the second calibration process on a periodic basis by activating the reference signal, the initiation independent of any detected frequency drift,
      determining a desired clock count corresponding to an approximated frequency of associated with the approximated number of cycles,
      outputting a local the measured oscillator frequency,
      counting a measured clock count corresponding to the measured oscillator frequency,
      determining an error count based on the measured clock count,
      comparing the error count with a threshold value,
      modifying the oscillator frequency of the local oscillator signal to a second frequency if the error count exceeds the threshold value, and
      discontinuing the second calibration process by deactivating the reference signal to conserve power during normal operation.

9. The method of claim 8, wherein the measured clock count is a total number of cycles the measured oscillator frequency counted during one cycle of the reference signal.

10. The method of claim 8, wherein modifying the oscillator frequency further comprises decrementing an oscillator tuning value associated with a voltage applied to the local oscillator, when the error count is greater than the desired clock count.

11. The method of claim 8, wherein modifying the oscillator frequency further comprises incrementing an oscillator tuning value associated with a voltage applied to the local oscillator, when the error count is lower than the desired clock count.

12. A multi-event sensor device comprising:
   a local oscillator circuit configured to generate an oscillating signal having a frequency at least partially based on an incoming control signal;
   a reference signal generator configured to be activated and generate a reference signal to initiate first and second calibration processes, the second calibration process initiated on a periodic basis independent of any detected frequency drift, and further configured to be deactivated to discontinue the first and second calibration processes and conserve power; and
   programmable calibration logic configurable to perform the first calibration process to initially tune the local oscillator circuit to a desired frequency, and reconfigurable to perform the second calibration process to maintain the local oscillator circuit at the desired frequency by comparing the frequency of the oscillating signal with a frequency of the reference signal and re-tuning the local oscillator circuit so that the frequency of the local oscillator circuit falls within a desired range;
   wherein the programmable calibration logic is configured to perform the first calibration process by
      approximating a number of cycles of the desired frequency in one cycle of the reference signal by multiplying a programmable value and a granularity factor, the granularity factor for reducing a number of bits in the programmable value while maintaining a reduced but sufficient precision in the approximated number of cycles, and
      iteratively adjusting an oscillator tuning value in accordance with a difference between a number of cycles of a measured oscillator frequency in one cycle of the reference signal and the approximated number of cycles.

13. The multi-event sensor device of claim 12, wherein the local oscillator circuit is a voltage controlled oscillator.

14. The multi-event sensor device of claim 12, further comprising a touch sensitive panel comprising:
   a plurality of event-sensing nodes configured to receive the oscillating signal and provide one or more panel output signals; and
   event sensor circuitry configured to process the panel output signal to determine whether an event has occurred.

15. The multi-event sensor device of claim 14, wherein the event-sensing nodes include at least two electrodes and output results from capacitances formed as a result of the interaction among the at least two electrodes.

16. The multi-event sensor device of claim 12, wherein the calibration logic comprises a counter that starts counting a number of cycles of the measured oscillator frequency upon an occurrence of first event triggered by the reference signal and stops counting the number of cycles in the oscillating signal upon an occurrence of a second event triggered by the reference signal to determine the number of cycles of the measured oscillator frequency.

17. The multi-event sensor device of claim 12, wherein the multi-event sensor device is an integral portion of a mobile telephone unit.

18. The multi-event sensor device of claim 12, wherein the multi-event sensor device is an integral portion of a portable audio player unit.

19. A multi-event sensor device, comprising:
   oscillator generation means for generating an oscillating signal;

reference signal generation means configured to be activated and generate a reference signal to initiate first and second calibration processes, the second calibration process initiated on a periodic basis independent of any detected frequency drift, and further configured to be deactivated to discontinue the first and second calibration processes and conserve power;

programmable calibration means configurable for performing the first calibration process to initially tune the oscillator generation means to a desired frequency, and reconfigurable for performing the second calibration process to maintain the oscillator generation means within a predetermined range; and event sensitive means for sensing a plurality of events occurring simultaneously or nearly simultaneously on an event-sensing panel;

wherein the programmable calibration means are configured to perform the first calibration process by approximating a number of cycles of the desired frequency in one cycle of a reference signal by multiplying a programmable value and a granularity factor, the granularity factor for reducing a number of bits in the programmable value while maintaining a reduced but sufficient precision in the approximated number of cycles, and iteratively adjusting an oscillator tuning value in accordance with a difference between a number of cycles of a measured oscillator frequency in one cycle of the reference signal and the approximated number of cycles.

20. The multi-event sensor device of claim 19, wherein the first calibration process uses a binary search algorithm to calibrate the oscillator generation means.

21. An electronic device comprising:
an event sensitive panel configured to receive an oscillating signal and generate an output signal based on the received oscillating signal;
an oscillating circuit configured to generate the oscillating signal having a frequency;
a reference signal generator configured to be activated and generate a reference signal to initiate first and second calibration processes, the second calibration process initiated on a periodic basis independent of any detected frequency drift, and further configured to be deactivated to discontinue the first and second calibration processes and conserve power; and
a programmable calibration controller configurable to perform the first calibration process by initially tuning the oscillating circuit to a desired frequency, and reconfigurable to perform the second calibration process to maintain the oscillating signal within the desired frequency range;
wherein the programmable calibration controller is configured to perform the first calibration process by
approximating a number of cycles of the desired frequency in one cycle of the reference signal by multiplying a programmable value and a granularity factor, the granularity factor for reducing a number of bits in the programmable value while maintaining a reduced but sufficient precision in the approximated number of cycles, and
iteratively adjusting an oscillator tuning value in accordance with a difference between a number of cycles of a measured oscillator frequency in one cycle of the reference signal and the approximated number of cycles.

22. The electronic device of claim 21, wherein the electronic device is a portable audio player.

23. The electronic device of claim 21, wherein the electronic device is a mobile telephone.

24. The method of claim 1, further comprising:
tuning the oscillator to a plurality of test frequency values;
stimulating the event-sensitive device with the plurality of test frequency values; and
analyzing output from the event-sensitive device stimulated with the plurality of test frequency values to determine the desired frequency value.

25. An apparatus for stimulating a touch sensor panel, comprising:
a reference oscillator configured for generating a reference signal only during a calibration phase;
a local oscillator circuit including a voltage controlled oscillator configured for receiving a control signal and generating a clock signal for use in stimulating the touch sensor panel; and
programmable calibration logic coupled between the reference oscillator and the local oscillator circuit for receiving the reference signal and the clock signal and generating the control signal;
wherein the programmable calibration logic is configurable for entering a first calibration phase to calibrate the clock signal against the reference signal and initially tune the clock signal to a desired frequency, and is reconfigurable for entering a second calibration phase only upon receiving the reference signal to maintain the clock signal at the desired frequency, the reference signal being generated on a periodic basis independent of any detected frequency drift;
wherein the programmable calibration logic is further configurable for entering a touch sensing phase and generating the control signal for the local oscillator circuit in an absence of the reference signal when the reference signal is not being generated; and
wherein the programmable calibration logic is configured to perform the first calibration phase by
approximating a number of cycles of the desired frequency in one cycle of a reference signal by multiplying a programmable value and a granularity factor, the granularity, factor for reducing a number of bits in the programmable value while maintaining a reduced but sufficient precision in the approximated number of cycles, and
iteratively adjusting an oscillator tuning value in accordance with a difference between a number of cycles of a measured oscillator frequency in one cycle of the reference signal and the approximated number of cycles.

26. The apparatus of claim 25, the calibration logic further configured for:
determining a programmable value representative of the desired frequency value of the clock signal; and
generating the control signal based on the programmable value, the control signal intended to generate the desired frequency.

27. The apparatus of claim 26, the calibration logic further configured for performing a binary search algorithm during the first calibration phase to adjust the control signal until the local oscillator circuit generates the desired frequency.

28. The apparatus of claim 26, the calibration logic further configured for:

tuning the local oscillator circuit to a plurality of test frequency values;

stimulating the touch sensor panel with the plurality of test frequency values; and analyzing output from the touch sensor panel stimulated with the plurality of test frequency values to determine the desired frequency.

29. The apparatus of claim 26, the calibration logic further configured for receiving a series of different programmable values to calibrate and tune the clock signal to a series of different frequencies to mitigate effects of static interference.

* * * * *

UNITED STATES PATENT AND TRADEMARK OFFICE
CERTIFICATE OF CORRECTION

| | | |
|---|---|---|
| PATENT NO. | : 7,907,020 B2 | Page 1 of 1 |
| APPLICATION NO. | : 11/947730 | |
| DATED | : March 15, 2011 | |
| INVENTOR(S) | : Thomas James Wilson | |

It is certified that error appears in the above-identified patent and that said Letters Patent is hereby corrected as shown below:

In column 13, line 40, delete "$1/2^{n}$" and insert -- $1/2^{m}$ --, therefor.

In column 17, line 44, in Claim 8, after "frequency" delete "of".

In column 17, line 46, in Claim 8, after "outputting" delete "a local".

In column 17, lines 52-53, in Claim 8, after "frequency" delete "of the local oscillator signal to a second frequency".

In column 17, line 59, in Claim 9, after "cycles" insert -- of --.

In column 20, line 49, in Claim 25, delete "granularity, factor" and insert -- granularity factor --, therefor.

In column 20, line 62, in Claim 26, after "frequency" delete "value".

Signed and Sealed this
Eighth Day of November, 2011

David J. Kappos
*Director of the United States Patent and Trademark Office*